United States Patent [19]

O'Connell et al.

[11] 4,134,151
[45] Jan. 9, 1979

[54] SINGLE SENSE LINE MEMORY CELL

[75] Inventors: Timothy R. O'Connell; Henry R. Edelstein; George S. Leach, all of Phoenix, Ariz.

[73] Assignee: Electronic Memories & Magnetics Corporation, Encino, Calif.

[21] Appl. No.: 792,798

[22] Filed: May 2, 1977

[51] Int. Cl.² .............................................. G11C 11/40
[52] U.S. Cl. .................................... 365/189; 365/154; 365/207; 307/238
[58] Field of Search .............................. 307/279, 290; 340/173 FF; 365/154, 189, 207

[56] References Cited

U.S. PATENT DOCUMENTS

| 3,949,381 | 4/1976 | Dennard et al. | 340/173 FF |
| 4,027,176 | 5/1977 | Heuber et al. | 340/173 FF |

Primary Examiner—Terrell W. Fears
Attorney, Agent, or Firm—Kleinberg, Morganstern, Scholnick & Mann

[57] ABSTRACT

A static memory cell is provided which can be written into or read from using only a single sense line, as contrasted to all previous systems which use two sense lines.

4 Claims, 1 Drawing Figure

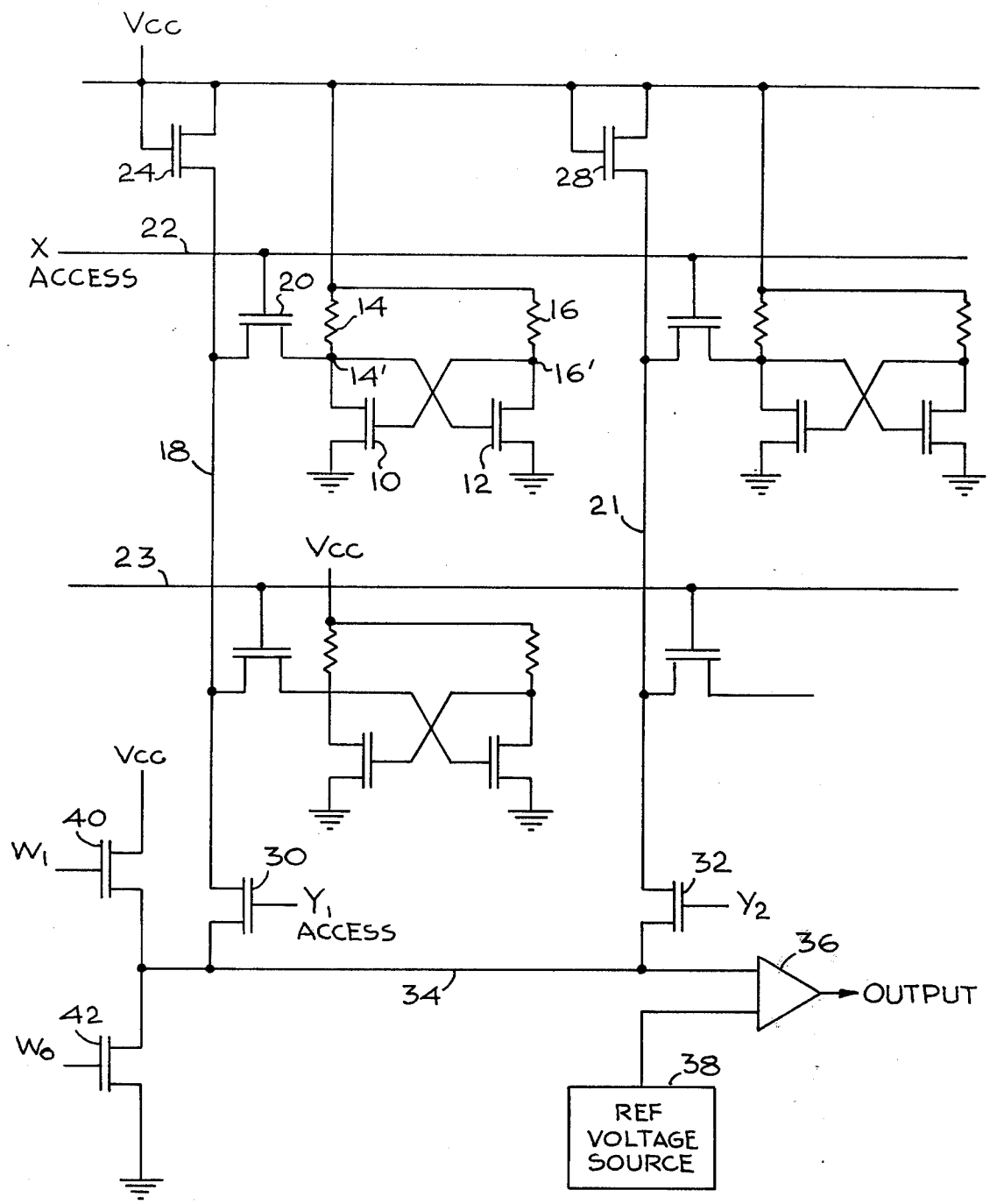

SINGLE SENSE LINE MEMORY CELL

BACKGROUND OF THE INVENTION

This invention relates to semiconductor memories and more particularly to improvements therein.

Present day semiconductor static memory systems have cells requiring the use of two sense lines for the purpose of reading information stored in each cell and for writing information into each cell. There are usually two transistors provided for each sense line and one further transistor coupling each sense line to a cell. Thus, with a memory of even modest size, which is on the order of 1000 cells, if one could eliminate the need for one of the sense lines, a substantial savings in material, processing time, and cost of the memory would be obtained. Also, the size of the memory could be reduced, since fewer components per given area would be needed.

OBJECTS AND SUMMARY OF THE INVENTION

An object of this invention is to provide a method and means whereby reading from or writing into a memory cell can be performed with a single sense line.

A further object of this invention is the provision of an arrangement for a semiconductor memory whereby, for each column of cells, only a single sense line is required.

Yet a further object of the present invention is the provision of a novel and less expensive method and means for fabricating the semiconductor memory.

The foregoing and other objects of the invention may be achieved in an arrangement whereby a single sense line is used for reading from or writing into a memory cell. The basic cell construction is basically the same as has been previously used, comprising two cross coupled field effect transistors (FET) each having its own pull up resistor connecting its drain to a source of potential. The source electrode of each transistor may be grounded. The sense line is coupled to one of the nodes of the cell, which is the junction between a pullup resistor and a drain electrode of an FET. This FET is enabled to conduct the current between the sense line and the node by connection to a bus line, which in a memory may constitute an X access bus. The sense line is connected in series with the drain electrode of an FET designated as the Y access FET. The source electrode of this FET is connected to two series connected FET's, one of which, when enabled connects to ground which is used when it is desired to write a zero in a cell. It may be designated as a write zero FET. The other FET, when enabled, permits current to flow through the sense line. It may be designated as the write one FET. The Y access FET is also connected to a comparator circuit.

When it is desired to read from a cell, the X and Y FETs are enabled. If the node in the cell, which is connected to the sense line by the X access FET is high, the sense line remains high and the detecting circuit will sense this. If the node to which the X access FET is connected is low, the sense line is pulled down low and this too is detected by the detector circuit which thereby senses whether a 1 or a 0 is stored in the memory cell.

For the purpose of writing a 1, the X access and Y access FETs as well as the write one FET are enabled whereby current flow in the sense line enables the application of a high voltage to the cell node to which the sense line is connected via the X access FET which voltage is high enough to cause the FET and the cell FET whose gate is connected to that node, to become conductive, thereby turning off the other FET in the cell and thereby storing a one. If it is desired to write a zero, then the write zero FET is turned on, which connects the sense line to ground for a time long enough to pull down the node to which the sense line is connected thereby disenabling the FET in the cell which has its gate electrode connected to the node coupled to the sense line. This results in the other FET in the cell being made conductive.

The novel features of the invention are set forth with particularity in the appended claims. The invention will best be understood from the following description when read in conjunction with the accompanying drawing which is a schematic diagram of a memory using an embodiment of the invention.

BRIEF DESCRIPTION OF THE DRAWINGS

The sole FIGURE illustrates a part of a memory wherein a single sense line embodiment of this invention is used.

DESCRIPTION OF THE PREFERRED EMBODIMENTS

The drawing is an illustration of part of a memory wherein a single sense line embodiment of this invention is used. Each memory cell comprises two FETs respectively 10, 12, each of which has its drain electrode connected through a high value resistor, respectively 14, 16, to a source of operating potential, designated as Vcc. The junction of the drain electrodes and the pullup resistors are designated as nodes respectively 14', 16'. Each node is cross coupled to the gate electrode of the other FET.

A single sense line, respectively 18, 21, serves as the Y access line for each column of cells in a memory. The sense line 18 is connected to the node, 14', through an FET 20. The drain electrode of this FET is connected to the sense line and the source electrode is connected to the node 14'. The gate elctrode of the FET 20 is connected to what may be designated as the X access bus 22. The gate electrode 20 for each cell in the row of memory cells is connected to this bus 22. A corresponding bus, such as 23, is provided for each row of memory cells.

Each single sense line 18, 21 is connected to the source of operating potential, Vcc, through a pull up FET, respectively 24, 28. The drain and gate electrodes of the FETs, 24, 28 are connected to Vcc. The source electrode of each FET 24 is connected to the sense line.

The other end of each sense line is connected to a Y access FET, respectively 30, 32. The drain electrodes of the respective FETs 30 and 32 are connected to the respective sense lines 18 and 21, and, the source electrodes of FETs 30, 32 are connected to a bus, 34, has one end connected to one input of a differential amplifier 36, which acts as a detector. A reference voltage from a source 38 is applied to the other differential amplifier input. The other end of the bus 34 is connected to the junction between the source elctrode of an FET 40, and the drain electrode of an FET 42. The drain electrode of FET 40 is connected to a source of operating potential such as Vcc, and the source electrode of FET 42 is connected to ground.

It is preferred that the FETs which are used in an arrangement shown and described herein be those made using the silicon gate process, since this provides FETs with performance characteristics of the kind required with this embodiment of the invention.

In order to write into a cell located at a particular intersection of the X and Y access busses, such as busses 22, and 18, enabling voltages are applied to the gates of the respective transistors 20 and 30. If it is desired to write a 0 into the cell then enabling voltage is also applied to the gate of FET 42. The result is that sense line 18 is substantially connected to ground or reference potential at one end. However, since the other end has a voltage applied thereto, through FET 24, the sense line will be at a low voltage level, essentially determined by the amount of current flowing through the line through the impedances presented by FETs 30 and 42. The node 14' is pulled down to this low voltage level, which is established at a value which will not cause FET 12 to become conductive, if it is not yet conductive, or if it is conductive, to be made non-conductive. When FET 12 becomes non-conductive its node 16' rises to a voltage level sufficiently high so that FET 10 whose gate is connected to that node can become conductive. However, since node 14' is still connected to the sense line 18, current will not flow through FET 10 until FET 20 is disenabled. At that time, the memory cell will store a zero.

If it is desired to store a one in the memory cell, then FETs 20 and 30 are enabled, as before as well as FET 40. As a result, the single sense line 18 rises substantially to the value of the potential Vcc, which is a high value. Node 14', if not at a high value, at this time, is pulled up to the value of the sense line 18 whereby FET 12 is enabled and FET 10 is disenabled.

In order to read, FETs 20 and 30 as well as FET 42 are all enabled. Sense line 18, as a result, has one end substantially at ground potential and the other end connected to Vcc. If node 14' is at a low potential, then the potential existing in sense line 18 is reduced. As a result the potential on bus 34 does not exceed that of the reference voltage source 38 and there will be no output from differential amplifier 36. However if the node 14' is high, because FET 10 is not conductive, then the bus 18, as well as the bus 34 wil rise in value and exceed the voltage level of the reference voltage source 38, whereby an output is obtained from the differential amplifier.

In constructing a memory cell, the impedance of FET 10 when conductive must be made high enough so that, in the process of writing, when the sense line is applying a high voltage to its node, the potential at the node should be maintained at a level which exceeds the threshold for turning on FET 12. However, its impedance must not be so high so that, when sensing the voltage at this node and FET 10 is enabled, a distinction should be able to be made between the voltage at this node when FET 10 is conducting and when FET 10 is not conducting. Fabrication of a memory cell to have the indicated properties is well within the abilities of those skilled in this art.

Accordingly, there has been described hereinabove a novel, useful single sense line semiconductor cell, for use in a memory, whether the memory be in a random access type or the read only memory type. By using a single sense line, the cost as well as the size of a memory may be reduced.

What is claimed is:

1. A semiconductor static memory system comprising:
   a plurality of memory cells arranged in columns and rows, each memory cell comprising a bistable flip-flop device having two FETs, each having its gate electrode connected to the drain electrode of the other FET;
   only a single sense line for each column of cells, all the cells in a column being coupleable only to the same only single sense line;
   means for applying an operating potential to one end of each sense line;
   only a single X access FET means for each cell, each operable for selectively coupling the cell to its corresponding only single line;
   detecting means operable when coupled to a cell for detecting data stored in the cell;
   a Y access FET means for each column for selectively coupling its corresponding only single sense line to said detecting means; and
   means selectively coupled to any one of said sense lines for enabling data storage in a cell coupled to that sense line or the detection by said detecting means of data stored in a cell coupled to that sense line.

2. In a static semiconductor memory system of the type having a plurality of bistable flip-flop type memory cells arranged in columns and rows, each memory cell having two FETs, each having its gate electrode connected to the drain electrode of the other FET, the improvement comprising:
   only a single sense line for each column of cells, all the cells in a column being coupleable only to the same only single sense line;
   only a single X access FET associated with each cell coupled between the only single sense line for the column including said cell and one of the drain electrodes of one of the FETs in said cell;
   means for applying an operating potential to one end of each sense line, and a Y access FET for each sense line connected in series with the sense line;
   detecting means connected to all of said Y access FETs; and
   FET means for applying a writing potential or a reference potential to all of said Y access FETs.

3. In a system as recited in claim 2 wherein an X access bus is provided for each row of memory elements,
   each X access FET in a row having a gate electrode connected to the X access bus for that row, a source electrode connected to the one of the drain electrodes of an FET in the associated cell, and a drain electrode connected to the sense line for the column including the cell with which said X access FET is associated.

4. In a system as recited in claim 2 wherein said FET means comprises first and second FETs,
   the drain electrode of said first FET being connected to the source electrode of said second FET,
   the source electrode of said first FET being connected to the source of reference potential, and
   the drain electrode of said second FET being connected to a source of operating potential.

* * * * *

UNITED STATES PATENT OFFICE
CERTIFICATE OF CORRECTION

Patent No. 4,134,151        Dated January 9, 1979

Inventor(s) Timothy O'Connell; Henry Edelstein; George Leach

It is certified that error appears in the above-identified patent and that said Letters Patent are hereby corrected as shown below:

Column 2, line 44,   the word "elctrode" should be spelled "electrode".

Column 4, line 18,   after "single" insert the word --sense--.

Signed and Sealed this

Third Day of April 1979

[SEAL]

Attest:

RUTH C. MASON
Attesting Officer

DONALD W. BANNER
Commissioner of Patents and Trademarks